US012618916B2

(12) United States Patent
Valtr et al.

(10) Patent No.: US 12,618,916 B2
(45) Date of Patent: May 5, 2026

(54) METHOD AND DEVICE FOR ESTIMATING AN INTERNAL RESISTANCE OF A BATTERY CELL

(71) Applicant: Volkswagen Aktiengesellschaft, Wolfsburg (DE)

(72) Inventors: Jiri Valtr, Prague (CZ); Marian Vlcek, Prague (CZ); Adam Hrazdira, Prague (CZ); Stefan Aust, Braunschweig (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 264 days.

(21) Appl. No.: 18/560,323

(22) PCT Filed: Mar. 10, 2022

(86) PCT No.: PCT/EP2022/056247
§ 371 (c)(1),
(2) Date: Nov. 10, 2023

(87) PCT Pub. No.: WO2022/242927
PCT Pub. Date: Nov. 24, 2022

(65) Prior Publication Data
US 2024/0241184 A1      Jul. 18, 2024

(30) Foreign Application Priority Data
May 20, 2021    (DE) .......................... 102021205162.6

(51) Int. Cl.
G01R 31/389          (2019.01)
G01R 31/367          (2019.01)

(52) U.S. Cl.
CPC ......... G01R 31/389 (2019.01); G01R 31/367 (2019.01)

(58) Field of Classification Search
CPC ............................. G01R 31/389; G01R 31/367
(Continued)

(56) References Cited

U.S. PATENT DOCUMENTS 10,670,664 B2 *    6/2020   Cha ...................... G01R 31/367
2003/0206021 A1    11/2003  Laletin et al.
(Continued)

FOREIGN PATENT DOCUMENTS

CN          111426968 A        7/2020
DE      102014220913 A1        4/2016
(Continued)

OTHER PUBLICATIONS

PCT/EP2022/056247, International Search Report (Jun. 27, 2022). Priority German Application No. 102021205162.6 Examination Report (Mar. 31, 2022).

*Primary Examiner* — Huy Q Phan
*Assistant Examiner* — Trung Q Nguyen
(74) *Attorney, Agent, or Firm* — Peter Zura; LOZA & LOZA, LLP

(57)                    ABSTRACT

Technologies and techniques for estimating an internal resistance of a battery cell. A voltage and a current are detected at the battery cell. A detected voltage differential is determined by differentiating the detected voltage using a filter, and a modelled voltage differential is determined from the detected current and an actual internal resistance estimation value is determined by differentiating using a filter. A correction factor is determined from the detected voltage differential and the modelled voltage differential, and a new actual internal resistance estimation value is estimated from the determined correction factor and the previous actual internal resistance estimation value, and the new actual internal resistance estimation value is provided as estimated internal resistance of the battery cell. A device configured for estimating an internal resistance of a battery cell is further disclosed.

19 Claims, 5 Drawing Sheets

(58) Field of Classification Search
 USPC ...................... 324/500, 600, 76.11, 415–433
 See application file for complete search history.

(56) References Cited

U.S. PATENT DOCUMENTS

| 2015/0088443 A1* | 3/2015 | Lorin ................ G01R 31/3842 |
| | | 702/63 |
| 2015/0258907 A1 | 9/2015 | Lee |
| 2020/0124676 A1* | 4/2020 | Tohara ................ G01R 31/374 |
| 2021/0311127 A1* | 10/2021 | Wada ................... H02J 7/0048 |
| 2021/0405121 A1* | 12/2021 | Zhang ................. G01R 31/367 |
| 2022/0006313 A1* | 1/2022 | Lim .................... H01M 10/486 |
| 2023/0029405 A1* | 1/2023 | Stefanopoulou ..... G01R 31/389 |
| 2024/0241184 A1* | 7/2024 | Valtr ................... G01R 31/389 |

FOREIGN PATENT DOCUMENTS

| JP | 2008164417 A | 7/2008 |
| JP | 2010271171 A | 12/2010 |
| JP | 2010286445 A | 12/2010 |
| WO | 2015083758 A1 | 6/2015 |
| WO | 2015110307 A1 | 7/2015 |

* cited by examiner

METHOD AND DEVICE FOR ESTIMATING AN INTERNAL RESISTANCE OF A BATTERY CELL

The present application claims priority to International Patent Application No. PCT/EP2022/056247 to Valtr et al., filed Mar. 10, 2022, titled "Method And Device For Estimating An Internal Resistance Of A Battery Cell," which claims priority to German Pat. App. No. DE 10 2021 205 162.6, filed May 20, 2021, to Valtr et al., the contents of each being incorporated by reference in their entirety herein.

TECHNICAL FIELD

The present disclosure relates to technologies and techniques for estimating an internal resistance of a battery cell.

BACKGROUND

Battery cells age over time, which adversely affects the operational properties. Aging manifests itself, in particular, in an increase in internal resistance and a decrease in the electrical capacity of the battery cell. By tracking the internal resistance, an aging process of the battery cell can be tracked. However, the internal resistance cannot be measured directly, but can only be estimated via a voltage at the battery cell and a current flowing through the battery cell. Various influencing factors, however, can make such an estimation more difficult: measurement noise, a disparity of the internal resistance during charging and discharging, the RC circuit-like behavior of the battery cell, as well as the fact that an equivalent circuit model typically used during modeling cannot perfectly map the electrochemical processes in the battery.

SUMMARY

Aspects of the present disclosure are directed to a method and a device for estimating an internal resistance of a battery cell, by way of which the internal resistance of the battery cell can be reliably estimated. Some aspects are disclosed in the subject matter of the independent claims. Other aspects are disclosed in the respective dependent claims, found below.

In some examples, a method is disclosed for estimating an internal resistance of a battery cell, comprising the following measures: detecting a voltage at the battery cell; detecting a current at the battery cell; determining a detected voltage differential by differentiating the detected voltage using a filter; determining a modeled voltage differential from the detected current and a present internal resistance estimated value by differentiation using a filter; determining a correction factor from the detected voltage differential and the modeled voltage differential; and estimating a new present internal resistance estimated value from the determined correction factor and the previous present internal resistance estimated value; and providing the new present internal resistance estimated value as an estimated internal resistance of the battery cell.

In some examples, a device for estimating an internal resistance of a battery cell is disclosed, comprising: interfaces that are configured to receive a voltage detected at the battery cell and a current detected at the battery cell; and a control device, wherein the control device is configured to determine a detected voltage differential by differentiating the detected voltage using a filter, to determine a modeled voltage differential from the detected current and a present internal resistance estimated value by differentiation using a filter, to determine a correction factor from the detected voltage differential and the modeled voltage differential, and to estimate a new present internal resistance estimated value from the determined correction factor and the previous present internal resistance estimated value, and to provide the new present internal resistance estimated value as an estimated internal resistance of the battery cell.

The method and the device make it possible to "teach" the internal resistance of the battery cell, proceeding from a reference value. The teaching may take place based on a differentially determined internal resistance, that is, the internal resistance is determined as a differential internal resistance. Initially, the reference value may correspond to the nominal internal resistance of the battery cell. The reference value may be set at the first present internal resistance estimated value, and is then updated by way of the measures of the method to a new present internal resistance estimated value with each present iteration. The updating may be carried out as follows: A modeled voltage is estimated from the detected current and the present internal resistance estimated value. Differentials are formed in each case from the detected voltage and the modeled voltage using (differentiating) filters by differentiation. This is based on the idea that an internal resistance can be determined and taught particularly well when the voltage (or the current) changes. A correction factor is determined from the ratio of the differentials with respect to one another. A new present internal resistance estimated value is estimated from the determined correction factor and the (previous) present internal resistance estimated value. The new present internal resistance estimated value is provided as an estimated internal resistance of the battery cell, in particular in the form of an analog signal or a digital signal.

An advantage of the method and of the device is that the internal resistance of the battery cell can be reliably determined. The use of differentiating filters makes it possible both to determine the differentials and to decrease measurement noise.

The method may be repeatedly carried out so as to continuously obtain a present internal resistance estimated value and, in this way, be able to track the aging of the battery cell via the estimated internal resistance.

The voltage and the current may be detected by means of sensors configured for this purpose. The sensors may also be part of the device.

In some examples, parts of the device, such as the control device configured to execute the methods disclosed herein, can, individually or together, be designed as a combination of hardware and software, for example as program code that is executed on a microcontroller or microprocessor. However, it may also be provided that parts, individually or together, are designed as an application-specific integrated circuit (ASIC) or a field-programmable gate array (FPGA).

Further features regarding the design of the device will be apparent from the description of designs of the method. The advantages of the device are in each case the same as with the designs of the method.

In some examples a vehicle is disclosed comprising at least one device according to one of the described embodiments. A vehicle may be configured as a motor vehicle. Generally, however, a vehicle may also be another land vehicle, a rail vehicle, a watercraft, an aircraft or a space craft. Generally, the method and the device, however, can also be employed in other mobile or stationary devices.

DESCRIPTION OF THE DRAWINGS

Aspects of the present disclosure will be described in more detail hereafter based on preferred exemplary embodiments with reference to the figures. In the drawings.

DETAILED DESCRIPTION

Figure 1:
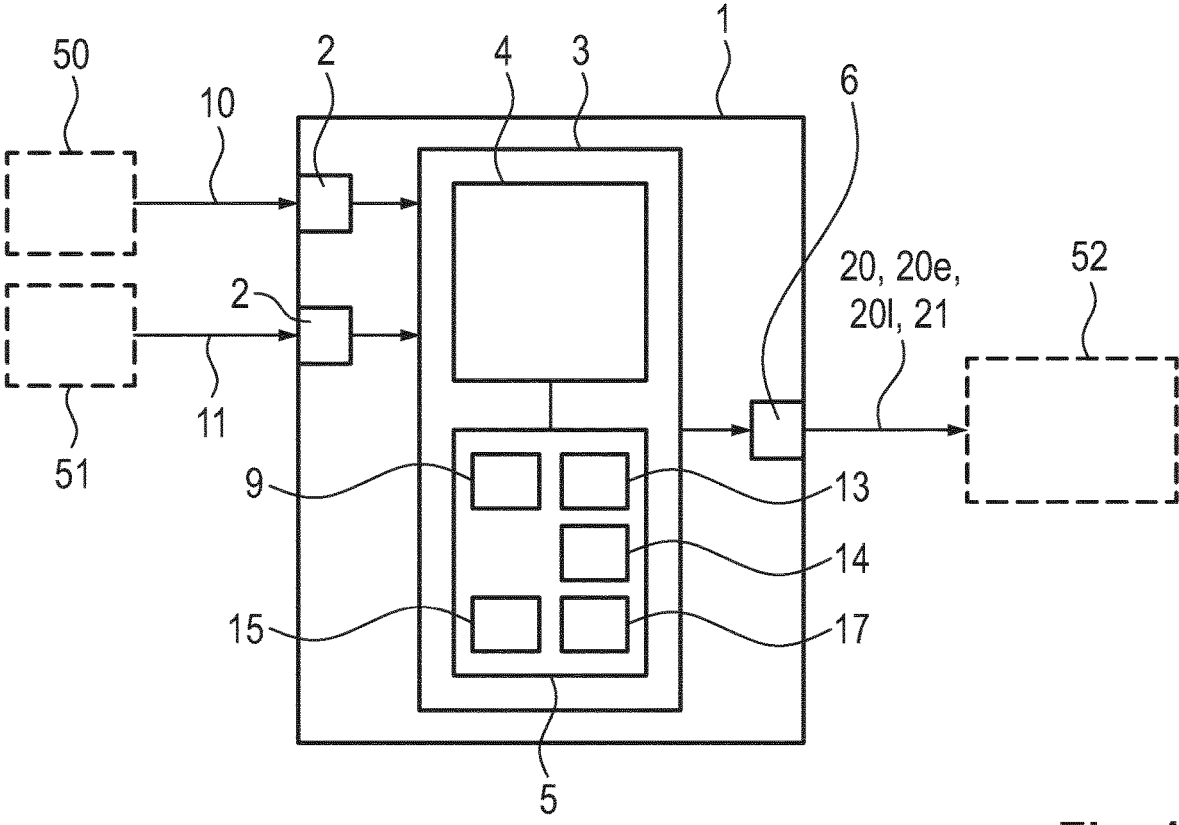
FIG. 1 shows a schematic representation of one embodiment of the device for estimating an internal resistance of a battery cell, according to come aspects of the present disclosure.

A portion of the methods are illustrated herein based on formulas. It is assumed in the process that a change in the current or the load results in a change in the detected voltage, which is proportional to the internal resistance $R_0$ of the battery cell. The internal resistance can be determined using the following equation for the differential resistance $R_{diff}$:

$$R_{diff} = \frac{dU}{dI}$$

Here, dU is the voltage differential, and dI is the current differential.

Using the differentiating filters FILTER($\cdot$), the detected voltage differential and the modeled voltage differential are determined from the detected voltage U and the detected current I:

$$dU_{detected} = \text{FILTER}(U)$$

$$dU_{Model} = \text{FILTER}(I \cdot R_0)$$

When a jump in the current occurs, the following must apply:

$$dU_{detected} = dU_{Model}$$

A correction factor $\alpha_k$ can then be determined from a ratio of the voltage differentials:

$$\frac{DU_{detected}}{DU_{model}} = \frac{R_0^{Real} dl}{f_k R_0^{Reference} dl} = \alpha_k$$

Here, $$R_0^{Reference}$$

is, in particular, the nominal internal resistance of the battery cell, which is used as the reference value, that is, in particular the internal resistance that the battery cell had upon delivery, while $$R_0^{Real}$$

is the real internal resistance of the battery cell. This real internal resistance is, in particular, estimated as the present internal resistance estimated value using the above equation and is provided.

Under ideal conditions, a new correction factor f can be obtained for each subsequent iteration by $$f_{k+1} = \alpha_k f_k$$

In this way, a present internal resistance estimated value can be estimated for each iteration step from the detected voltage and the detected current.

In one embodiment, it is provided that the filters are designed as antisymmetric filters having a finite impulse response. These are particularly well-suited for being able to achieve both a differentiation and noise reduction. The noise reduction takes place, in particular, by a low-pass behavior of the filter or filters. The antisymmetric filter having a finite impulse response is, in particular, designed so as to be differentiating for low frequencies and reduce noise (low-pass behavior).

In one embodiment, it is provided that, during the determination of the correction factor, this factor is estimated using at least one estimation filter. In this way, short-term fluctuations can be decreased. In particular, the at least one estimation filter has a smoothing effect over the time.

In one refining embodiment, it is provided that the at least one estimation filter is designed as a Kalman filter. The advantage is that, in addition to the estimated result, a Kalman filter can also provide a degree of the confidence of the estimated result, so that additionally information about the reliability of the estimated internal resistance of the battery can be provided.

In one embodiment, it is provided that at least one of the voltage differentials is compared to a predefined threshold value, wherein the measures for determining the estimated internal resistance are triggered when a value of one of the voltage differentials reaches or exceeds the predefined threshold value. This has the advantage that the measures for determining the new present internal resistance are, in particular, (only) carried out when the conditions for teaching the internal resistance of the battery cell are ideal, that is, when a large change in voltage and/or current exists, which results in a favorable signal-to-noise ratio. A suitable threshold value can, for example, be ascertained empirically and/or by simulation.

In one embodiment, it is provided that a power flow direction is distinguished, wherein a current direction is determined for this purpose, and a charging internal resistance estimated value and/or a discharging internal resistance estimated value are determined as a function of the determined current direction, and these are provided as power flow direction-dependent internal resistances of the battery cell. In this way, an internal resistance can be determined as a function of the power flow. The procedure for both instances is essentially analogous to the procedure described above. In particular, however, it is provided that a dedicated present internal resistance estimated value is determined for each power flow direction (charging/discharging). In some examples, a direction of the power flow is determined, in particular based on a current direction (with a corresponding voltage). In this way, a teaching of the correction factor or factors can also be carried out when a change of sign of the current occurs. If, for example, a jump in the current occurs from –100 A to 50 A at a voltage maintaining constant polarity, the first two thirds of this jump can be attributed to a negative power flow direction (for example charging), while the last third can be attributed to a positive power flow direction (for example discharging). The first two thirds of the signal jump are then used to estimate the internal resistance at a negative power flow, and the last third is used to estimate the internal resistance at a positive power flow. For this purpose, for example, the individual values of the antisymmetric filter having a finite impulse response can be accordingly evaluated in ranges. For this purpose, the antisymmetric filter having a finite impulse response is, in particular, temporally arranged at the center of the signal jump. Since the coefficients in the first part of the antisymmetric filter are negative, and those in the second part of the filter are positive (or vice versa), the respective parts can be used for determining a moving average of the current values before and after the signal jump with a change in power flow. Signal noise can be reduced using the moving averages, whereby a signal-to-noise ratio can be improved.

FIG. 1 shows a schematic representation of one embodiment of the device 1 for estimating an internal resistance 20 of a battery cell. The device 1 is designed to carry out the methods described in the present disclosure. The methods are explained based on the device 1.

The device 1 comprises interfaces 2, which are configured to receive a voltage 10 detected at the battery cell and a current 11 detected at the battery cell. This may also be a combined interface 2. The voltage 10 is detected using a voltage sensor 50 at the battery cell. The current 11 is detected using a current sensor 51 at the battery cell.

The device 1 furthermore comprises a control device 3. The control device 3 comprises a processing device 4 and a memory 5. The processing device 4 is, for example, a microprocessor or a microcontroller on which program code is being executed to carry out the method described in the present disclosure. However, it is also possible for hard-wired hardware components to be provided, which carry out part or all of the method. The device 1 may also be part of a battery control system (not shown).

The control device 3 may be configured to determine a detected voltage differential 15 by differentiating the detected voltage 10 using a filter. The filter is, in particular, an antisymmetric filter having a finite impulse response. The control device 3 may be furthermore configured to determine a modeled voltage differential 13 from the detected current 11 and a present internal resistance estimated value 9 by differentiation using a filter. In some examples, the filter is an antisymmetric filter having a finite impulse response.

The control device 3 furthermore determines a correction factor 17 from the detected voltage differential 15 and the modeled voltage differential 13. Moreover, the control device 3 estimates a new present internal resistance estimated value 9 from the determined correction factor 17 and the previous present internal resistance estimated value 9, and provides the new present internal resistance estimated value 9 as an estimated internal resistance 20 of the battery cell, for example as an internal resistance signal 21, for example at an interface 6. The estimated internal resistance 20 or the internal resistance signal 21 can, for example, be fed to a battery control system 52.

It may be provided that, during the determination of the correction factor 17, this factor is estimated using at least one estimation filter.

In a refining embodiment, it may be provided that the at least one estimation filter is designed as a Kalman filter.

It may be provided that at least one of the voltage differentials 13, 15 is compared to a predefined threshold value 14, wherein the measures for determining the estimated internal resistance 20 are triggered when a value of one of the voltage differentials 13, 15 reaches or exceeds the predefined threshold value 14.

Figure 2A:
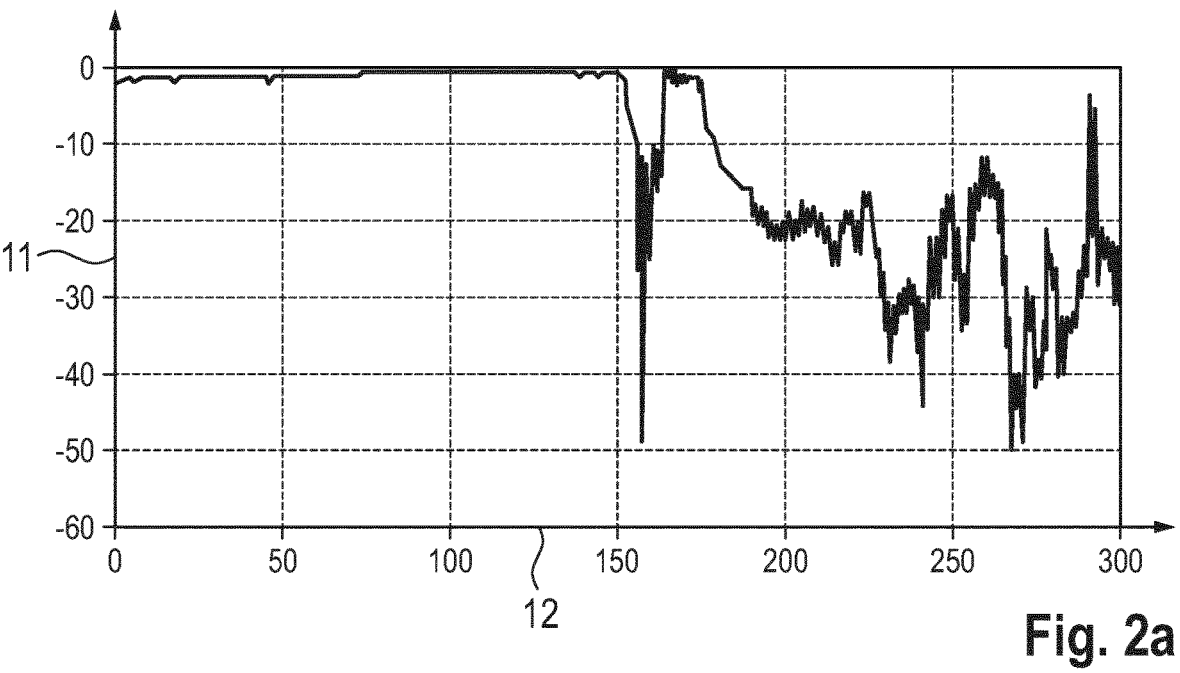
FIG. 2a shows a schematic diagram of the detected current over the time, according to come aspects of the present disclosure.
Figure 2B:
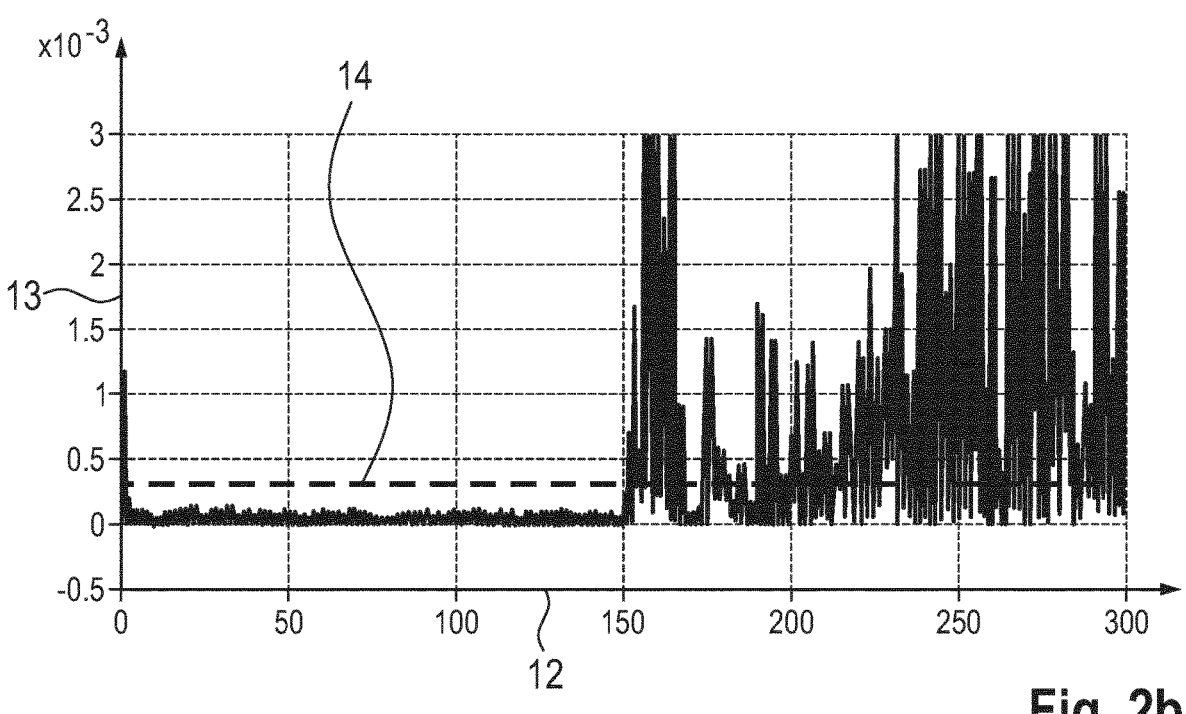
FIG. 2b shows a schematic diagram of the modeled voltage differential over the time, according to come aspects of the present disclosure.

This is schematically illustrated in FIGS. 2*a* and 2*b* FIG. 2*a* shows the detected current 11 in A over the time 12 in seconds. FIG. 2*b* shows the absolute value of the modeled voltage differential 13 in volts per second over the time 12 in seconds, which was determined from the detected current 11 and the present internal resistance estimated value of the battery cell by differentiation using the filter, and in particular using the antisymmetric filter having a finite pulse response. At the point in time of approximately 150 seconds, the absolute value of the modeled voltage differential 13 exceeds the predefined threshold value 14. After the predefined threshold value 14 has been reached or exceeded, the measures for determining the estimated internal resistance 20 are carried out, so that an updated estimated internal resistance 20 (FIG. 1) of the battery cell can be provided. In this way, favorable values of the voltage 10 and of the current 11 can be used for teaching the present internal resistance 20 with respect to a signal-to-noise behavior.

Figure 3:
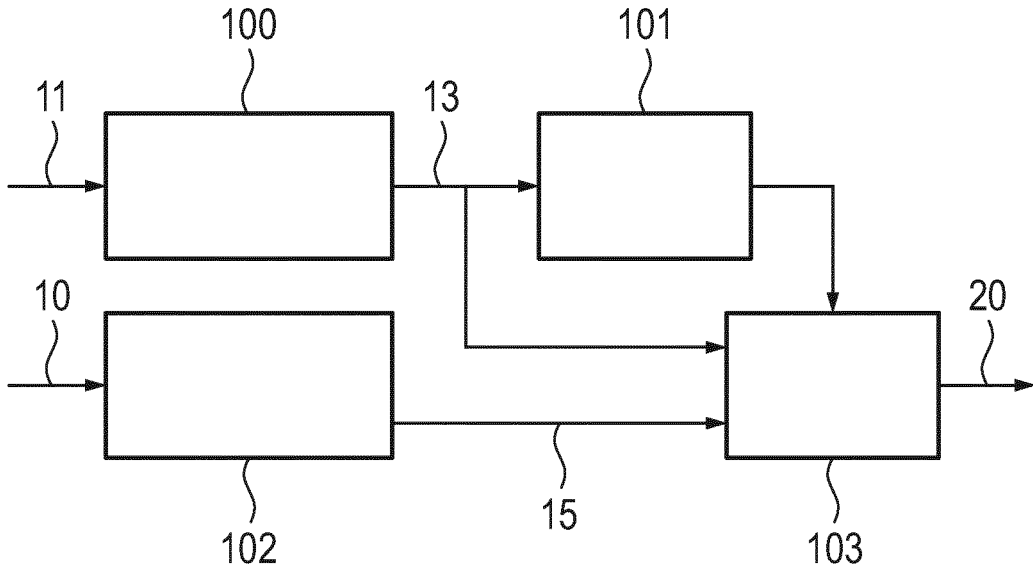
FIG. 3 shows a schematic representation to illustrate one embodiment of the method, according to come aspects of the present disclosure.

This embodiment is illustrated in the form of a schematic flow chart in FIG. 3. For this purpose, for example, the modules 100 to 103 (FIG. 3) are provided in the control device 3 (FIG. 1). The detected current 11 is converted into a voltage in a module 100 using the present internal resistance estimated value. This voltage is converted into the modeled voltage differential 13 using a differentiating filter, in particular using an antisymmetric filter having a finite impulse response. This modeled voltage differential 13 is compared to a predefined threshold value in a module 101 (see also FIG. 2*b*). If the threshold value comparison in module 101 shows that the value was reached or exceeded, the measures for determining a new present internal resistance estimated value or an updated internal resistance 20 are started in a module 103; otherwise, the threshold value comparison is continuously repeated with present values for the detected current.

For carrying out the measures in the module 103, a detected voltage differential 15 is fed to the module 103, which is generated in module 102 from the detected voltage 10 using a differentiating filter, and in particular using an antisymmetric filter having a finite impulse response. Furthermore, the modeled voltage differential 13 is fed to the module 103. In the module 103, the teaching of a (new updated) correction factor is then carried out, by way of which a present internal resistance 20 of the battery cell can be estimated.

It may be provided that a power flow direction is distinguished. For this purpose, the control device 3 (FIG. 1) determines a flow direction. The control device 3 determines a charging internal resistance estimated value and/or a discharging internal resistance estimated value as a function of the determined flow direction, and makes these available as power flow direction-dependent internal resistances 201, 20e (charging, discharging) of the battery cell.

Figure 4A:
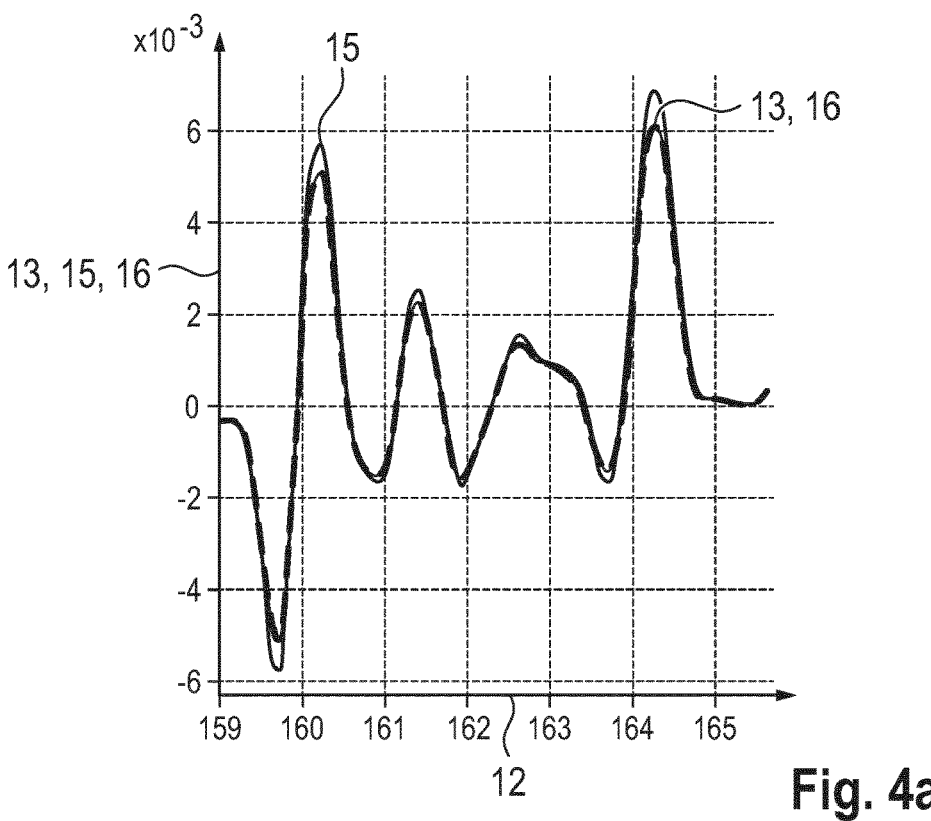
FIGS. 4a, 4b show schematic diagrams to illustrate the method described in the present disclosure, according to come aspects of the present disclosure.
Figure 4B:
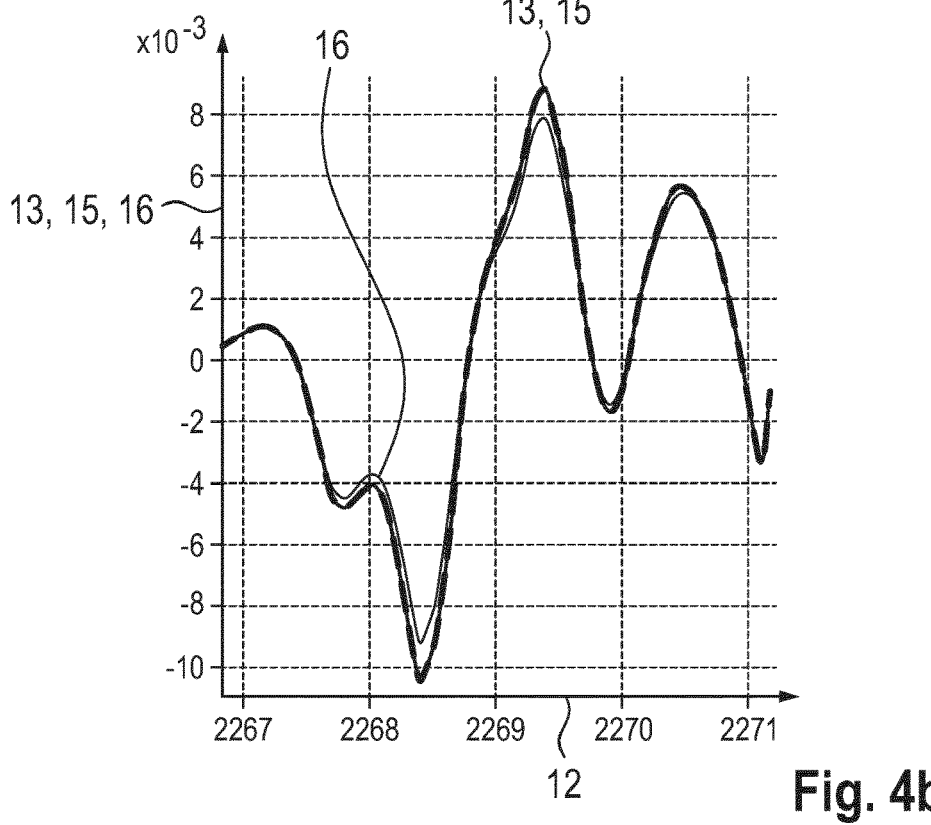

FIGS. 4a and 4b show schematic diagrams to illustrate the method described in the present disclosure. Shown are curves of the detected voltage differential 15 as well as of a voltage differential 16 that was determined with the aid of the nominal internal resistance (as the reference internal resistance or starting initial resistance) of the battery cell, and of the modeled voltage differential 13 in V over the time 12 in seconds. It is apparent that, at the start of the method, that is, after approximately 160 seconds (FIG. 4a), the modeled voltage differential 13 coincides with the voltage differential 16, and has deviations with respect to the detected voltage differential 15, in particular at the peaks. After approximately 2270 seconds, the modeled voltage differential 13, in contrast, has adapted to the detected voltage differential 15, which took place, in particular, by adaptation of the present internal resistance estimated value by way of the correction factor. The learning effect is thus clearly apparent.

Figure 5A:
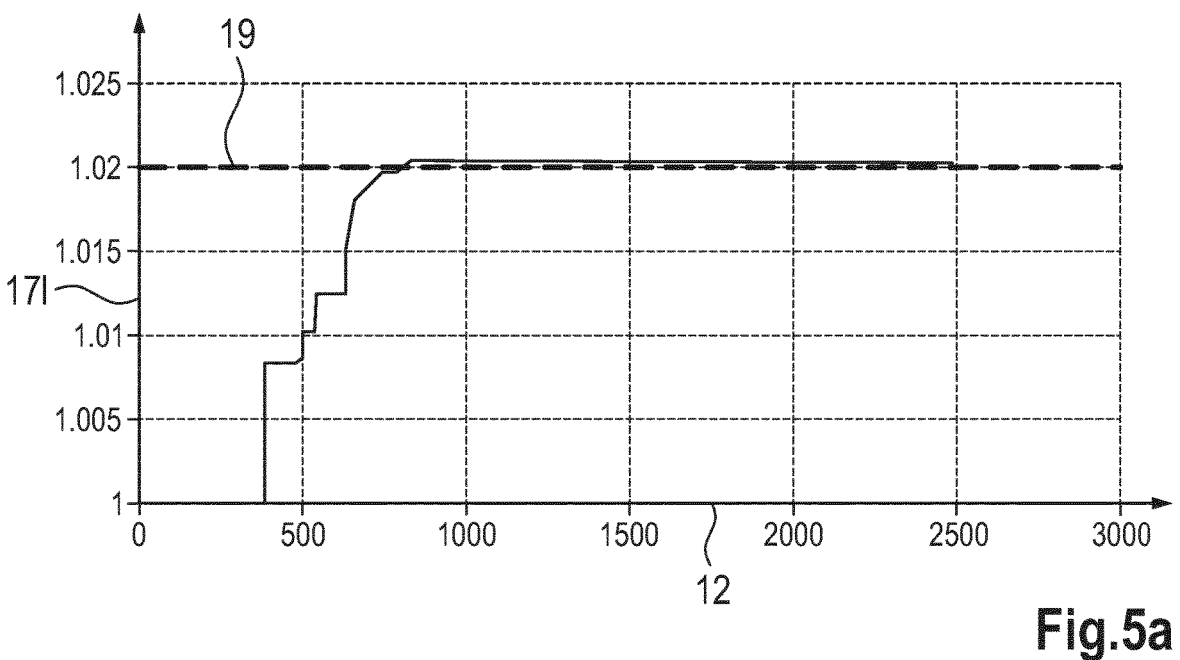
FIGS. 5a, 5b show schematic diagrams to illustrate one embodiment of the method, according to come aspects of the present disclosure.
Figure 5B:
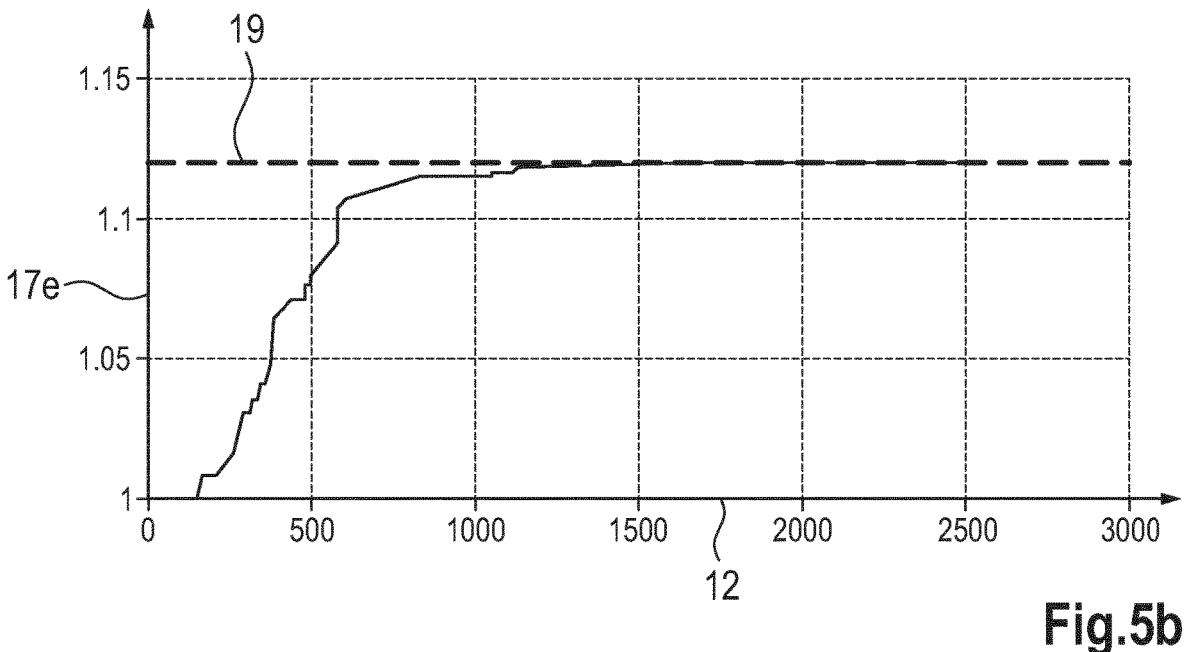

FIGS. 5a and 5b show schematic diagrams to illustrate one embodiment of the method. It is provided that a power flow direction is distinguished, wherein a current direction is determined for this purpose, and a charging internal resistance estimated value and/or a discharging resistance estimated value are determined as a function of the determined current direction, and these are provided as power flow direction-dependent internal resistances of the battery cell. It is furthermore provided in the embodiment that, during the determination of the correction factors 171, 17e, these factors are each estimated using an estimation filter, wherein each of the estimation filters is designed as a Kalman filter.

FIG. 5a shows the correction factor 171, 17e of the charging internal resistance estimated value over the time 12 in seconds. FIG. 5b shows the correction factor 171, 17e of the discharging internal resistance estimated value over the time 12 in seconds. It is apparent that the values of the correction factors 171, 17e for the charging internal resistance estimated value and the discharging internal resistance estimated value differ from one another. Accordingly, the charging internal resistance estimated value determined using the correction factor 171 and the discharging internal resistance estimated value determined using the correction factor 17e also differ from one another.

Furthermore, it is clearly apparent how, starting from an initial value (=1) of the correction factors 171, 17e, the respective value over the time incrementally approaches a value of the respective basic truth 19.

The method and the device allow an internal resistance of a battery cell to be reliably estimated. Advantages include, in particular, a teaching of a correction factor whenever a signal-to-noise ratio is favorable. Furthermore, power flow-dependent internal resistances can be estimated and provided so that a distinction can be made between an internal resistance during charging and an internal resistance during discharging. As should be appreciated by those skilled in the art, the technologies and techniques disclosed herein may be applied to numerous real-world applications for notification and/or optimization of vehicle functions, including optimizing charging strategies, energy management, performance optimization, safety enhancement and/or lifecycle management.

LIST OF REFERENCE NUMERALS

1 device
2 interface

3 control device
4 processing device
5 memory
6 interface
9 present internal resistance estimated value
10 detected voltage
11 detected current
12 time
13 modeled voltage differential
14 predefined threshold value
15 detected voltage differential
16 voltage differential (reference internal resistance)
17 correction factor
171 correction factor (charging)
176 correction factor (discharging)
19 basic truth
20 internal resistance
201 internal resistance (charging)
20e internal resistance (discharging)
21 internal resistance signal
50 voltage sensor
51 current sensor
52 battery control system
100-103 modules

The invention claimed is:

1. A device for estimating an internal resistance of a battery cell, comprising:
   interfaces configured to receive a voltage detected at the battery cell and a current detected at the battery cell; and
   a control device comprising at least one filter, and operatively coupled to the interfaces, the control device being configured to:
      determine a detected voltage differential by differentiating the detected voltage using a filter;
      determine a modeled voltage differential from the detected current and a present internal resistance estimated value by differentiation, wherein the modeled voltage differential represents a differential voltage across the battery cell derived from the detected current and the present internal resistance estimated value;
      determine a correction factor from the detected voltage differential and the modeled voltage differential;
      estimate a new present internal resistance estimated value from the determined correction factor and the previous present internal resistance estimated value; and
      provide the new present internal resistance estimated value as an estimated internal resistance of the battery cell.

2. The device according to claim 1, wherein the at least one filer is configured as antisymmetric filters having a finite impulse response.

3. The device according to claim 1, wherein, determining the correction factor comprises performing an estimation using at least one estimation filter.

4. The device according to claim 3, wherein the at least one estimation filter comprises a Kalman filter.

5. The device according to claim 1, wherein the control device is configured to:
   compare at least one of the voltage differentials to a predefined threshold value; and
   provide the new present internal resistance estimated value as an estimated internal resistance of the battery cell when a value of one of the voltage differentials reaches or exceeds the predefined threshold value.

6. The device according to claim 1, wherein the control device is configured to:

determine a power flow direction and a current direction; and determine a charging internal resistance estimated value and/or a discharging internal resistance estimated value as a function of the determined current direction; and provide the charging internal resistance estimated value and/or the discharging internal resistance as power flow direction-dependent internal resistances of the battery cell.

7. A method for estimating an internal resistance of a vehicle battery cell, comprising:

detecting a voltage at the battery cell;

detecting a current at the battery cell;

determining, via at least one filter, a detected voltage differential by differentiating the detected voltage using a filter;

determining, via the at least one filter, a modeled voltage differential from the detected current and a present internal resistance estimated value by differentiation, wherein the modeled voltage differential represents a differential voltage across the battery cell derived from the detected current and the present internal resistance estimated value;

determining, via a control device, a correction factor from the detected voltage differential and the modeled voltage differential; and estimating, via the control device, a new present internal resistance estimated value from the determined correction factor and the previous present internal resistance estimated value; and providing the new present internal resistance estimated value as an estimated internal resistance of the battery cell.

8. The method according to claim 7, wherein the at least one filer is configured as antisymmetric filters having a finite impulse response.

9. The method according to claim 7, wherein, determining the correction factor comprises performing an estimation using at least one estimation filter.

10. The method according to claim 9, wherein the at least one estimation filter comprises a Kalman filter.

11. The method according to claim 7, further comprising:

comparing at least one of the voltage differentials to a predefined threshold value; and providing the new present internal resistance estimated value as an estimated internal resistance of the battery cell when a value of one of the voltage differentials reaches or exceeds the predefined threshold value.

12. The method according to claim 7, further comprising:

determining a power flow direction and a current direction; and determining a charging internal resistance estimated value and/or a discharging internal resistance estimated value as a function of the determined current direction; and providing the charging internal resistance estimated value and/or the discharging internal resistance as power flow direction-dependent internal resistances of the battery cell.

13. The method according to claim 7, wherein providing the new present internal resistance estimated value comprises providing the new present internal resistance estimated value to a vehicle comprising one of a motor vehicle, a rail vehicle, a watercraft, an aircraft or a space craft.

14. A vehicle, comprising:

a device for estimating an internal resistance of a battery cell, wherein the device comprises interfaces configured to receive a voltage detected at the battery cell and a current detected at the battery cell, and a control device comprising at least one filter, and operatively coupled to the interfaces, the control device being configured to:

determine a detected voltage differential by differentiating the detected voltage using a filter;

determine a modeled voltage differential from the detected current and a present internal resistance estimated value by differentiation, wherein the modeled voltage differential represents a differential voltage across the battery cell derived from the detected current and the present internal resistance estimated value;

determine a correction factor from the detected voltage differential and the modeled voltage differential;

estimate a new present internal resistance estimated value from the determined correction factor and the previous present internal resistance estimated value; and provide the new present internal resistance estimated value as an estimated internal resistance of the battery cell.

15. The vehicle according to claim 14, wherein the at least one filer is configured as antisymmetric filters having a finite impulse response.

16. The vehicle according to claim 14, wherein, determining the correction factor comprises performing an estimation using at least one estimation filter.

17. The vehicle according to claim 16, wherein the at least one estimation filter comprises a Kalman filter.

18. The vehicle according to claim 14, wherein the control device is configured to:

compare at least one of the voltage differentials to a predefined threshold value; and provide the new present internal resistance estimated value as an estimated internal resistance of the battery cell when a value of one of the voltage differentials reaches or exceeds the predefined threshold value.

19. The vehicle according to claim 14, wherein the control device is configured to:

determine a power flow direction and a current direction; and determine a charging internal resistance estimated value and/or a discharging internal resistance estimated value as a function of the determined current direction; and provide the charging internal resistance estimated value and/or the discharging internal resistance as power flow direction-dependent internal resistances of the battery cell.

* * * * *